US012638783B2

(12) United States Patent
Liertzer et al.

(10) Patent No.: US 12,638,783 B2
(45) Date of Patent: May 26, 2026

(54) CORRECTION OF THERMAL EXPANSION IN A LITHOGRAPHIC DEVICE

(71) Applicant: IMS Nanofabrication GmbH, Brunn am Gebirge (AT)

(72) Inventors: Matthias Liertzer, Hinterbrühl (AT); Christoph Spengler, Vienna (AT); Wolf Naetar, Vienna (AT); Elmar Platzgummer, Vienna (AT)

(73) Assignee: IMS Nanofabrication GmbH, Brunn am Gebirge (AT)

( * ) Notice: Subject to any disclaimer, the term of this patent is extended or adjusted under 35 U.S.C. 154(b) by 518 days.

(21) Appl. No.: 18/185,280

(22) Filed: Mar. 16, 2023

(65) Prior Publication Data

US 2023/0296989 A1    Sep. 21, 2023

(30) Foreign Application Priority Data

Mar. 21, 2022    (EP) ..................................... 22163287

(51) Int. Cl.
H01J 37/302     (2006.01)
G03F 7/00     (2006.01)

(52) U.S. Cl.
CPC ........ G03F 7/7055 (2013.01); G03F 7/70891 (2013.01); H01J 37/3026 (2013.01); H01J 2237/30461 (2013.01)

(58) Field of Classification Search
None
See application file for complete search history.

(56) References Cited

U.S. PATENT DOCUMENTS 2,369,796 A    2/1945   Ramberg
2,503,173 A    4/1950   Reisner
(Continued)

FOREIGN PATENT DOCUMENTS

DE          869995 C      3/1953
DE          892036 C     10/1953
(Continued)

OTHER PUBLICATIONS

Extended European Search Report for European Application No. 21175588.9, Search Completed Nov. 8, 2021, Mailed Nov. 16, 2021, 12 Pgs.
(Continued)

*Primary Examiner* — James Choi
(74) *Attorney, Agent, or Firm* — KPPB LLP

(57)          ABSTRACT
A pattern writing method for charged-particle lithography apparatuses using an improved correction for thermal distortion of the substrate includes determining an exposure position where the beam impinges on the substrate and the power of the beam at the exposure position; calculating heating of the substrate at the exposure position, and calculating, for a plurality of locations over the substrate, and the thermal diffusion and radiative cooling; calculating, for the same or a reduced plurality of locations on the substrate, the positional change of the substrate due to thermal expansion; determining a displacement distance which compensates the positional change at the exposure position, updating the structure to be written by shifting the exposure position of the beam by said displacement distance, and writing the updated structures on the substrate with the beam. These steps are repeated as a function of time and/or varying exposure position of the beam substrate position.

16 Claims, 9 Drawing Sheets

(56)  References Cited

U.S. PATENT DOCUMENTS

| | | | |
|---|---|---|---|
| 2,714,678 | A | 8/1955 | Otto |
| 4,806,766 | A | 2/1989 | Chisholm |
| 4,912,405 | A | 3/1990 | Richardson |
| 5,847,959 | A | 12/1998 | Veneklasen et al. |
| 5,892,237 | A | 4/1999 | Kawakami et al. |
| 6,424,879 | B1 * | 7/2002 | Chilese ............... H01J 37/3174 |
| | | | 700/121 |
| 6,443,699 | B1 | 9/2002 | Mashey |
| 6,768,125 | B2 * | 7/2004 | Platzgummer ...... H01J 37/3174 |
| | | | 250/492.1 |
| 6,858,118 | B2 | 2/2005 | Platzgummer et al. |
| 7,067,820 | B2 | 6/2006 | Buijsse |
| 7,199,373 | B2 | 4/2007 | Stengl et al. |
| 7,214,951 | B2 | 5/2007 | Stengl et al. |
| 7,276,714 | B2 | 10/2007 | Platzgummer et al. |
| 7,772,574 | B2 | 8/2010 | Stengl et al. |
| 7,781,748 | B2 | 8/2010 | Platzgummer |
| 8,183,543 | B2 | 5/2012 | Platzgummer |
| 8,222,621 | B2 | 7/2012 | Fragner et al. |
| 8,304,749 | B2 | 11/2012 | Platzgummer et al. |
| 8,378,320 | B2 | 2/2013 | Platzgummer |
| 8,546,767 | B2 | 10/2013 | Platzgummer et al. |
| 9,017,903 | B2 | 4/2015 | Tu et al. |
| 9,053,906 | B2 | 6/2015 | Platzgummer |
| 9,165,745 | B2 | 10/2015 | Luo |
| 9,269,543 | B2 | 2/2016 | Reiter et al. |
| 9,443,699 | B2 | 9/2016 | Platzgummer et al. |
| 9,495,499 | B2 | 11/2016 | Platzgummer et al. |
| 9,520,268 | B2 | 12/2016 | Platzgummer |
| 9,568,907 | B2 | 2/2017 | Platzgummer et al. |
| 9,653,263 | B2 | 5/2017 | Platzgummer et al. |
| 10,012,900 | B2 | 7/2018 | Kim et al. |
| 10,325,757 | B2 | 6/2019 | Platzgummer et al. |
| 10,483,080 | B1 | 11/2019 | Cook et al. |
| 2004/0135102 | A1 | 7/2004 | Muraki et al. |
| 2005/0242303 | A1 | 11/2005 | Platzgummer |
| 2007/0228293 | A1 * | 10/2007 | Ogasawara ......... H01J 37/3174 |
| | | | 250/492.3 |
| 2009/0057571 | A1 | 3/2009 | Goto |
| 2010/0155597 | A1 | 6/2010 | Preikszas et al. |
| 2011/0049393 | A1 | 3/2011 | De Boer et al. |
| 2011/0204253 | A1 * | 8/2011 | Platzgummer ........ H01J 37/045 |
| | | | 250/396 R |
| 2012/0091318 | A1 | 4/2012 | Wieland et al. |
| 2012/0286173 | A1 | 11/2012 | Van De Peut et al. |
| 2012/0314198 | A1 * | 12/2012 | Lee ........................ B82Y 40/00 |
| | | | 355/77 |

| | | | |
|---|---|---|---|
| 2014/0264085 | A1 | 9/2014 | Van De Peut et al. |
| 2015/0311031 | A1 | 10/2015 | Platzgummer et al. |
| 2016/0064180 | A1 | 3/2016 | Ren et al. |
| 2020/0312619 | A1 | 10/2020 | Mangnus et al. |
| 2022/0384143 | A1 | 12/2022 | Platzgummer et al. |
| 2023/0015805 | A1 | 1/2023 | Spengler et al. |
| 2023/0052445 | A1 | 2/2023 | Platzgummer et al. |
| 2023/0360878 | A1 | 11/2023 | Puchberger et al. |
| 2023/0360880 | A1 | 11/2023 | Eder-kapl et al. |
| 2024/0021403 | A1 | 1/2024 | Puchberger et al. |

FOREIGN PATENT DOCUMENTS

| | | |
|---|---|---|
| DE | 893107 C | 10/1953 |
| DE | 1035813 B | 8/1958 |
| EP | 2187427 A2 | 5/2010 |
| EP | 2363875 A1 | 9/2011 |
| GB | 689527 A | 4/1953 |
| WO | 0062324 A2 | 10/2000 |
| WO | 2012041464 A1 | 4/2012 |

OTHER PUBLICATIONS

Extended European Search Report for European Application No. 22163287.0, Search completed Aug. 24, 2022, Mailed Sep. 7, 2022, 7 Pgs.

Extended European Search Report for European Application No. 22171589.9, Search completed Oct. 24, 2022, Mailed Nov. 7, 2022, 5 Pgs.

Extended European Search Report for European Application No. 22172309.1, Search completed Dec. 19, 2022, Mailed Jan. 3, 2023, 22 pgs.

Extended European Search Report for European Application No. 22185177.7, Search completed Feb. 16, 2023, Mailed Feb. 27, 2023, 18 Pgs.

Extended European Search Report for European Application No. 22189892.7, Search completed Feb. 20, 2023, Mailed Mar. 21, 2023, 10 Pgs.

Extended European Search Report for European Application No. 21185599.4, Search Completed Jan. 4, 2022, Mailed Jan. 17, 2022.6 pgs.

Mueller, "Regelbare magnetostatische Linsensysteme fur Elektronenmikroskope—[Variable magnetostatic lens systems for electron microscopes]", Zeitschrift fur Wissenschaftliche Mikroskopie und Furmikroskopische Technik, Hirzel Verlag, Stuttgart, DE, May 31, 1957, vol. 63, No. 5, pp. 303-328.

* cited by examiner

61 ES_SOURCE

62 UD_THERMD

63 UD_DISTOR

64 UD_CRRMAP

65 APCRR_WR

Δt 71
72
74 73
76 75 t          Δt

CORRECTION OF THERMAL EXPANSION IN A LITHOGRAPHIC DEVICE

CROSS-REFERENCE TO RELATED APPLICATION

The current application claims priority to European Patent Application No. 22163287.0 filed on Mar. 21, 2022, the disclosure of which is incorporated herein by reference in its entirety for all purposes.

FIELD OF THE INVENTION

The invention relates to pattern writing methods employed in charged-particle lithography apparatuses. Methods of this kind are used in reticle manufacturing or maskless direct-write lithography.

BACKGROUND

Particle lithography apparatuses can be used as tools in patterning multicomponent nanostructures. Lithography apparatus can perform writing on a substrate using charged particle beams.

SUMMARY OF THE INVENTION

Pattern writing methods can be achieved, in accordance with the present invention, by a method for writing a pattern on a substrate in a charged particle lithographic apparatus using a scanning exposure by means of a charged particle beam, with regard to a pattern to be formed on a surface of the substrate, wherein the beam is directed to a sequence of (defined) exposure positions on the substrate surface and at each exposure position the beam is used to write structures on the substrate within a beam range around the respective exposure position according to a respective pattern portion which represents a corresponding sub region of the pattern to be written, where the method comprises the steps, with regard to a respective exposure position, of
  determining, based on the exposure position, the power of the beam imparted to the substrate at the exposure position;
  calculating heating of the substrate generated by the beam during an exposure duration associated with (at least) the exposure position, and calculating, for a plurality of locations defined in a predetermined array over the surface of the substrate, the amount of thermal diffusion and radiative cooling due to thermal emission of the substrate;
  calculating, for a plurality of locations defined in a predetermined array over the surface of the substrate, the positional change of the substrate resulting from thermal expansion (as caused by the substrate heating and thermal effects as calculated in the previous step);
  calculating a displacement distance, said displacement distance describing said positional change at the exposure position, and
  applying a correction to exposure position and/or the pattern portion associated with the exposure position using the displacement distance, and
  continuing writing structures on the substrate by means of the beam according to the exposure position and pattern portion thus corrected,
  wherein the above steps are carried out for each of a sequence of exposure durations, each of said exposure durations covering a time interval associated with one or more subsequent exposure positions, wherein the calculations for a respective time interval are done with respect to the results of the calculations obtained for the time interval respectively preceding the respective time interval. Herein, the expression "subsequent exposure positions" is used with regard to the sequence of defined locations that the beam assumes as a function of time, and is meant to denote a number of exposure positions that are immediately following each other; in other words, a pass through the above steps is executed for an exposure duration and the set of subsequent exposure positions associated therewith, and passes through the steps are repeated for the sequence of exposure durations. Furthermore, "beam range" denotes the beam spot generated by the total beam on the substrate at a given time, in view of the fact that the beam spot has a well-defined finite size on the target (this finite size may often be uniform over the sequence of exposure positions). Also, it is to be noted that an exposure duration may include not only one exposure position, but a (typically considerable) number of subsequent exposure positions, as further explained below.

This solution offers an efficient approach for calculating, and compensating for, the effects of thermal heating during the writing process in a charged particle lithographic apparatus. In particular, the handling of thermal effects and mechanical strain in separate steps offers a reduction of computation time and improved accuracy during the writing process.

The step of calculating the positional change of the substrate may include calculating mechanical strain as a result of thermal expansion (which is caused by the substrate heating/cooling/diffusion as calculated in the respective previous step) and optionally additional mechanical constraints. The optional mechanical constraints may be used to allow for additional mechanical forces applied externally to the substrate or fixation of the substrate at defined points, or the like. Thus, calculating mechanical strain may include, as additional mechanical constraints, effects of mechanical stress which are introduced by external forces including holding forces applied to the substrate at a predetermined number of mounting positions, and/or effects of a number of fixed mounting positions of the substrate at each of which the amount of positional change is a predetermined value, such as a value of zero positional change.

As a simple and efficient approach for calculating thermal diffusion, many embodiments may use the inhomogeneous heat equation, which includes a source sink function and which includes thermal emissivity calculated as proportional, by a common constant of proportionality, to the difference of fourth powers of the substrate temperature and ambient temperature (in accordance with Stefan-Boltzmann law); as a simplified alternative, in particular where the amplitude of temperature variations is low so as to allow linearization, it may be instead calculated as proportional to the difference of the substrate temperature to an ambient temperature. In this approach, the constant of proportionality of thermal emissivity may be determined, for instance, beforehand by writing markers on a test substrate at several different stages of a writing process, measuring deformation positions of said writing markers, and performing a best-fit calculation of the constant of proportionality to the deformation positions thus measured. Alternatively, the constant of proportionality may be determined by fitting to substrate temperature measurements performed in-situ. Here, the term "in situ" is used to denote that the measurement is done beforehand on a test substrate, which is treated with a test writing process in the same charged particle lithographic apparatus where thereafter the pattern is written on the substrate, wherein the test substrate and the test writing process are representative for the substrate (typically, substrate and test substrate are of the same type of substrate) and the pattern written on the substrate.

As a simple and efficient approach for calculating substrate heating by the beam, many embodiments may employ that the rate of heating is calculated as being proportional to a predetermined beam power, where the proportionality is governed by a constant of proportionality. This constant of proportionality may, for instance, be determined beforehand by writing markers on a test substrate at several different stages of a writing process, measuring deformation positions of said writing markers, and performing a best-fit calculation of the constant of proportionality to the deformation positions thus measured. Alternatively, the constant of proportionality may be determined by fitting to substrate temperature measurements performed in-situ. Here as well, the term "in situ" is used to denote that the measurement is done beforehand on a test substrate undergoing a test writing process in the same charged particle lithographic apparatus where thereafter the pattern is written on the substrate, the test substrate and the test writing process being representative for the substrate and the pattern written on the substrate.

Furthermore, in many embodiments it will reduce the complexity of calculations, where mechanical stress, strain and distortion are calculated by linear elasticity. In addition, gravity (acting on the substrate) may be taken into account when calculating mechanical stress, strain and distortion. Moreover, it can be advantageous to allow for special constraints which correspond to boundary conditions, such as one or more of the following: normal and shear stresses disappearing at free boundaries of the substrate; substrate distortion disappearing at clamping mounts of the substrate; and substrate mounting points generating mechanical stress on the substrate.

Also, other parameters which relate to respective mechanical or thermomechanical properties of the substrate may be determined in advance. This may, advantageously, be achieved using a test substrate, performing a test writing process in the same charged particle lithographic apparatus where thereafter the pattern is written on the substrate, where the test substrate and the test writing process are representative for the substrate and the pattern written on the sub-strate; then, quantities enabling to determine said parameters are measured, and from these quantities the parameters are calculated. The parameters thus determined can then be used in the method of the invention, in particular for calculating thermal heating, heat diffusion, radiation effects, and mechanical stress and strain and the deformation resulting therefrom.

Preferably, all or at least some of the above-mentioned steps of the method may be performed in real-time during a process for writing the pattern on the substrate using actual exposure positions, pattern and current density values registered by the exposure control system.

The method of the invention is of particular advantage in the context of a stripe scanning writing strategy, such as the writing method described in U.S. Pat. No. 9,053,906 by the applicant. In such a stripe scanning writing approach the substrate is exposed stripe by stripe, and the calculating steps (i.e., the steps which, in the above enumeration of method steps, start with the word "calculating") are performed for each stripe before exposing the respective stripe, preferably using the results of shifting exposure positions obtained for respectively previous stripes, or more advantageously, for a number of consecutive durations which each correspond to a respective portion of each stripe before writing the structures of the pattern portions that belong to the respective stripe or portion of the stripe (of the same stripe and possibly also at least the previous stripe) are used.

Furthermore, it is often advantageous to also take into account heating effects accumulated over a course of subsequent exposure positions of the particle beam. Thus, in many embodiments the step of calculating heating of the substrate generated by the beam on the substrate at the exposure position may also include prior heating of the substrate generated by the beam during its path on the substrate prior to said exposure position.

In order to reduce the required computation power, it is desirable—and in fact often well sufficient—to perform the instances of thermal calculations only for a reduced number of times on the substrate, and in particular at considerably less often as compared to the plurality of exposure positions that the beam scans during a writing process. Thus, the step of calculating the amount of thermal diffusion and radiative cooling may be repeated only for a sequence of exposure durations which respectively comprise a number of subsequent exposure positions extending over at least a first distance which is larger than the width of a beam range on the substrate surface, for instance by at least one order of magnitude (i.e., a factor of 10 or higher). Moreover, the instances of calculations for the mechanical strain calculations may even be less often. Thus, the step of calculating the positional change of the substrate and/or mechanical strain may only be repeated for a sequence of secondary durations which is coarser than the sequence of exposure durations, wherein said secondary durations respectively comprise a number of subsequent exposure positions extending over at least a second distance which is larger than said first distance, for instance by at least one order of magnitude.

In some embodiments of the invention, the calculation of beam-induced heating of the substrate may be done with reduced accuracy, so as to further reduce computational complexity and obtain a modeling of the heating which is simple to implement. This may be done in the step of calculating heating of the substrate generated by the beam on the substrate, for instance, by modeling the heat track of the beam as a sequence of "heating spots" which each contribute heat to the substrate according to a predetermined spatial distribution (e.g., Gaussian distribution) at the substrate surface, where preferably the spatial distribution has a width which is significantly wider than the actual beam range. In particular, each heating spot may be centered at one of a sequence of deposition positions representing the average of the beam position over a respective subinterval of the respective time interval associated with one or more subsequent exposure positions.

Furthermore, there are different possibilities of applying the correction to the pattern portion based on the displacement distance. For instance, the correction may be applied by shifting the exposure position of the beam by the displacement distance to obtain an updated exposure position, followed by writing structures on the substrate according to pattern portion and the exposure position thus updated. Alternatively, the correction may be applied by recalculating the pattern portion by shifting structures contained in the pattern portion by the displacement distance to obtain an updated pattern portion, followed by writing structures on the substrate by means of the beam according to the exposure position and the pattern portion thus updated. These two approaches may be combined, so as to have a combination of shifting the exposure position of the beam by a first displacement to obtain an updated exposure position, and recalculating the pattern portion by shifting structures contained in the pattern portion by a second displacement to obtain an updated pattern portion, wherein the first and second displacements taken together result in the displacement distance; and then the corresponding structures are written on the substrate according to the exposure position and pattern portion thus updated.

BRIEF DESCRIPTION OF THE DRAWINGS

In the following, the present invention is illustrated by several embodiments described below in more detail with reference to the attached drawings. It is emphasized that the embodiments shown here are of illustrative character and are not to be construed as limiting the scope of the invention. The drawings schematically show:

FIG. 6A illustrates a mount allowing lateral movements, and FIG. 6B illustrates a clamping mount which fixes the substrate at the mounting point.

DETAILED DESCRIPTION

The invention relates to pattern writing methods employed in charged-particle lithography apparatuses. Methods of this kind are used in reticle manufacturing or maskless direct-write lithography. The applicant describes such methods and apparatuses, for instance, in U.S. Pat. Nos. 9,520,268, 6,768,125, 8,222,621 and 8,378,320, although not all aspects of the mentioned patent disclosures need to be present to make use of the invention.

Various embodiments of the invention concern the correction of pattern placement errors due to thermal expansion of a target (also referred to as substrate) during a writing process, which is continuously heated by the charged particle beam employed for the writing process. The generated heat diffuses during the exposure process and gradually dissipates by convection and thermal radiation, causing a varying deformation of the target. The inventors found that the heating of the target and ensuing thermal expansion exhibits strong spatial inhomogeneity, which causes severe effects of deformation in the target and deteriorates the quality and precision of position of features generated with the writing process, all the more since the deformation will change fast over time.

Figure 10:
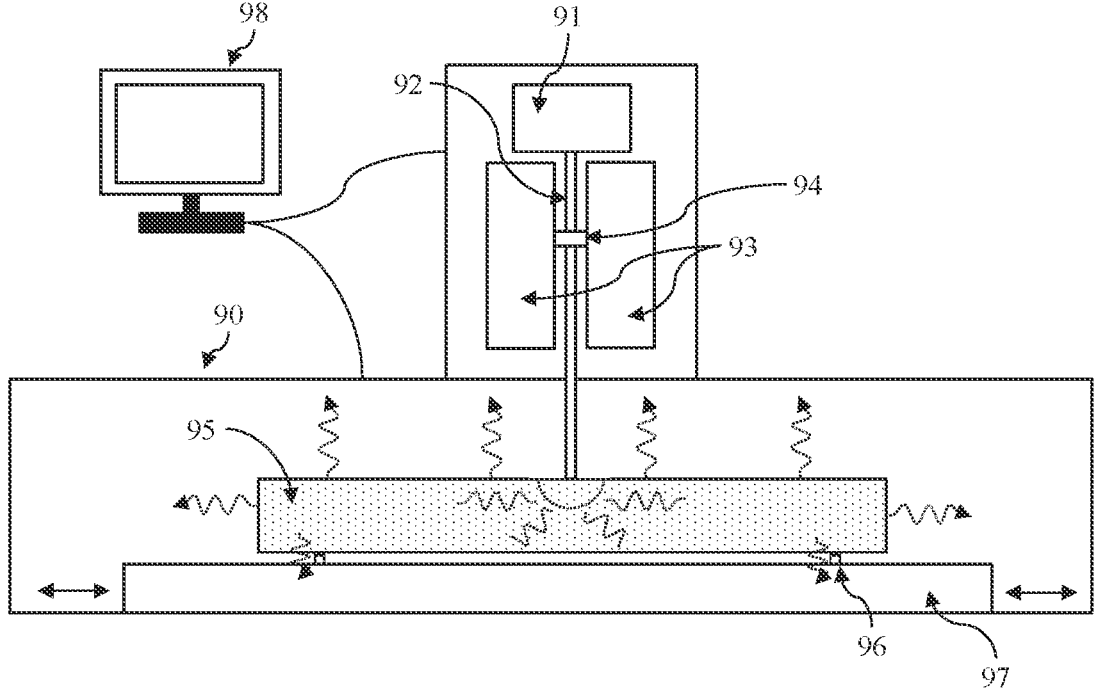
FIG. 10 illustrates a charged-particle multi-beam system of state of the art in a longitudinal sectional view.

A typical implementation of the invention utilizes a charge-particle exposure apparatus as illustrated in FIG. 10 (not to scale), which includes a charged particle illumination system 91 generating a charged particle beam 92, a projection optics system 93, a beam-shaping or aperture array device 94 modifying the shape of the beam or the pattern transferred to the substrate. Furthermore, the apparatus includes an exposure chamber 90 containing a target 95 to be exposed (e.g. a resist-covered quartz photomask or silicon wafer) which is mechanically fixed with clamps 96 (or other types of mounts) to a moving stage 97. The exposure apparatus is controlled by a processing system 98. Further details about charged-particle exposure apparatus can be found in the above-mentioned published patent documents. The processes of heat diffusion, as well as convection and thermal radiation are symbolically denoted by wavy lines and arrows in FIG. 10.

In view of the above it is an aim of the present application to provide an approach for dealing with the effects of local heating and heating-caused deformation of the target during a writing process in charged-particle lithography apparatuses.

The detailed discussion given herein is intended to illustrate the invention and exemplary embodiments thereof, as well as further advantageous developments. It will be evident to the skilled person to freely combine several or all of the embodiments and aspects discussed here as deemed suitable for a specific application of the invention. Throughout this disclosure, terms like "advantageous", "exemplary" or "preferred" indicate elements or dimensions which are particularly suitable (but not essential) to the invention or an embodiment thereof, and may be modified wherever deemed suitable by the skilled person, except where expressly stated otherwise. It will be appreciated that the invention is not restricted to the exemplary embodiments discussed in the following, which are given for illustrative purpose and merely present suitable implementations of the invention.

In particular, even though the invention can be used in combination with virtually any charged particle lithographic apparatus performing a scanning exposure, it will be discussed in the exemplary context of electron-beam devices for lithographic mask manufacturing. A device suitable for implementing the invention is described above with reference to FIG. 10. In particular, in the lithography apparatus of FIG. 10 the calculation and correction methods described hereinafter may suitably be performed in the processing system 98 of the lithography apparatus and/or any other control system for processing the data and controlling the writing process on a substrate (the terms substrate and target are used interchangeably herein). Further details about multi-beam charged-particle tools can be found in U.S. Pat. Nos. 9,520,268, 6,768,125, 8,222,621 and 8,378,320 and references cited therein, which are all herewith included by reference as part of the disclosure.

Thermal Expansion

Figure 1:
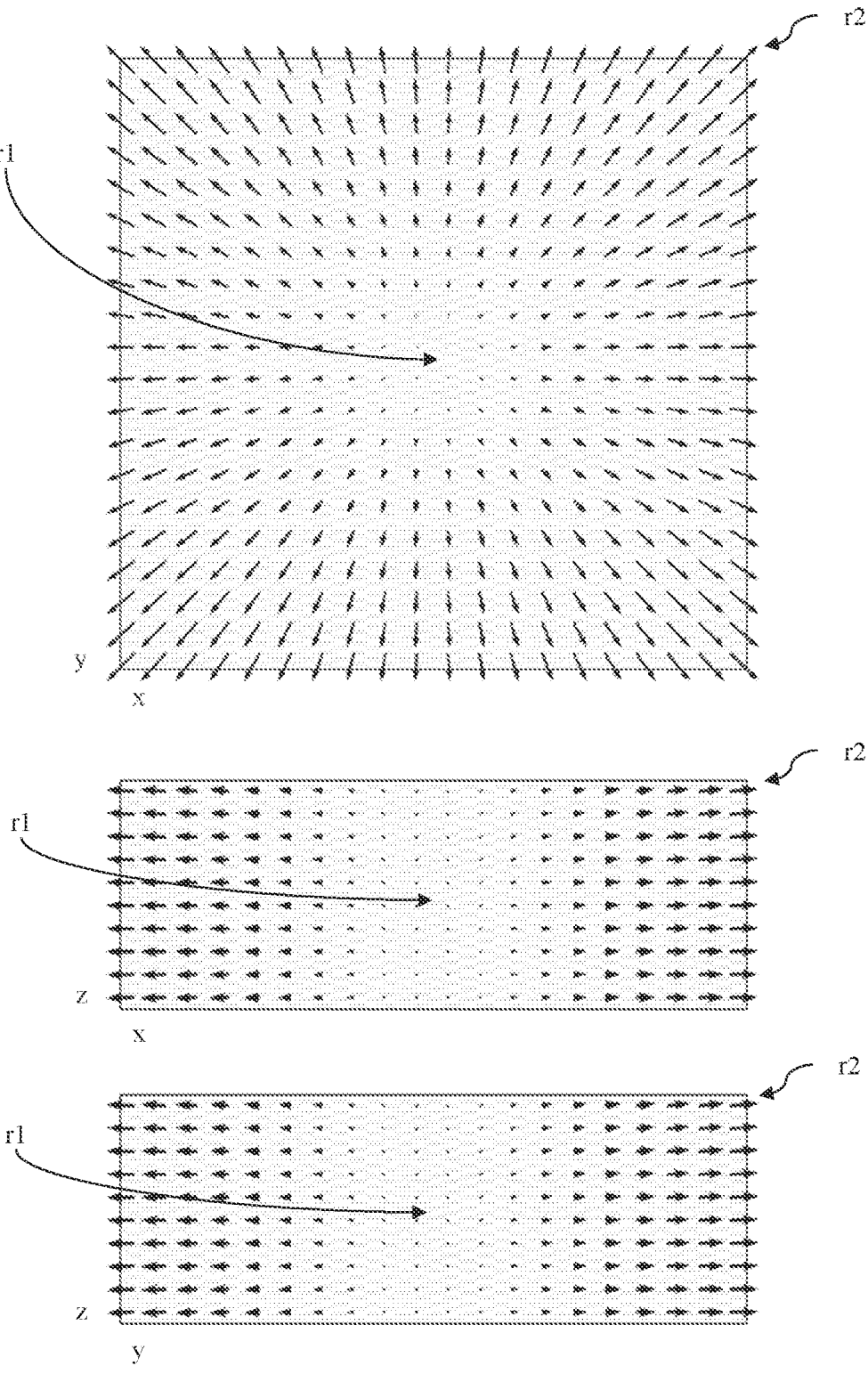
FIG. 1 depicts an example of a thermal expansion of a substrate due to homogeneous heating.
Figure 2:
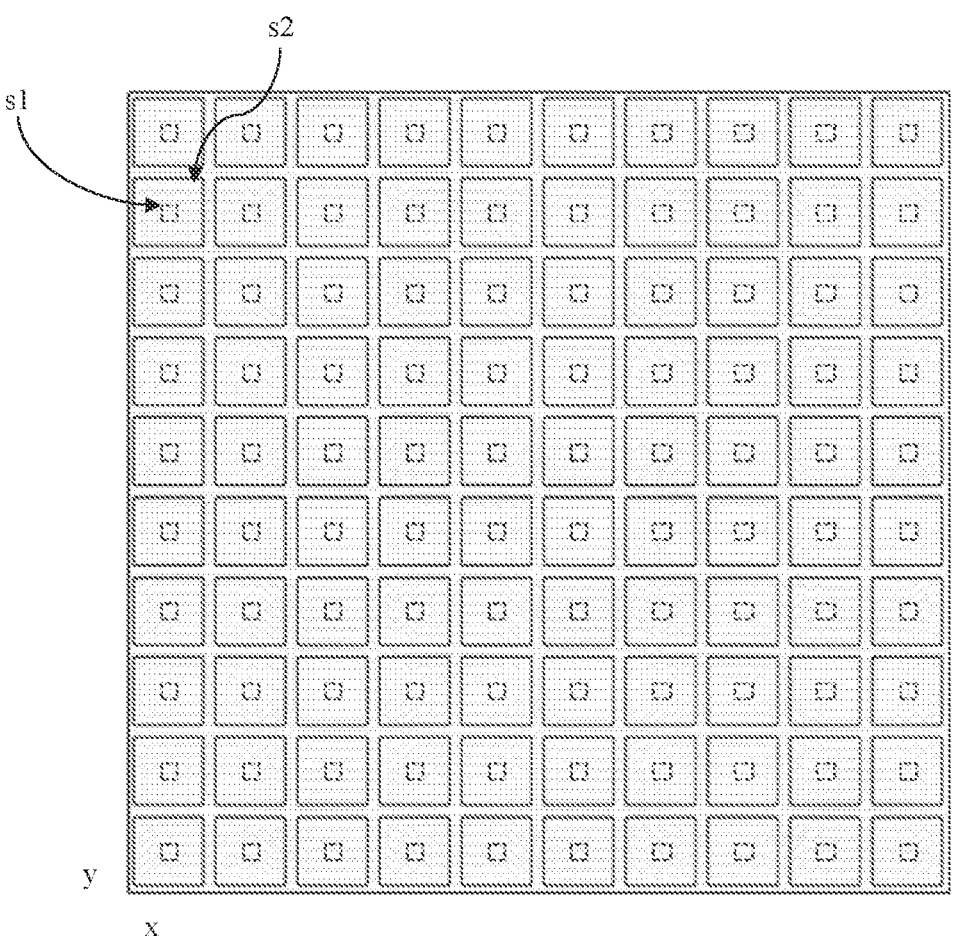
FIG. 2 illustrates the thermal strain in the substrate of FIG. 1.

It is well known from prior art (e.g. U.S. Pat. Nos. 6,424,879, 5,847,959, 9,017,903, 10,012,900) that a reticle experiences thermal expansion, leading to significant deviations of placement of the structures (referred to as registration errors) during exposure. A current implementation of a typical writing apparatus such as the applicant's so-called MBMW, for instance, employs an electron beam that arrives at the target with a maximal current of around 1 μA and 50 keV particle energy for mask writing. Assuming a 100% pattern density and no stage recovery times, the electron beam energy corresponds to a constant heating effect of 0.04 W, if 80% of the electron beam's energy is converted to heat at the substrate. For a typical fused quartz 6" photomask, by virtue of Stefan-Boltzmann's law, thermal equilibrium is reached at $\Delta T = 0.59 K$, assuming a typical value of mask emissivity of $\overline{\in} = 0.25$ and an ambient temperature of 295 K. If the mask, which has a thermal expansion coefficient of $\alpha_L = 5.5 \cdot 10^{-7}$ $K^{-1}$ for instance, can expand freely, it will expand by around $3.2 \cdot 10^{-5} \%$, leading to a maximal distortion of around 35 nm at a corner of the mask relative to its center. The above scenario, that is, the thermal distortion for a homogeneous temperature increase, is illustrated in FIG. 1 in three projection planes (where x, y, z, respectively, are maximal within the substrate). The mask center r1 is used as a reference point, with the maximal lateral distortion reached in the corners, indicated as r2. Since photomasks are typically only around 6.35 mm thick, the vertical distortion r3, r4 of a freely expanding mask is not as significant (around 1.5 nm in the corner, given the above temperature increase). FIG. 2 shows the corresponding thermal strain (i.e. the deformation s2 of an infinitesimal element s1 at a given position) in the xy-plane, which, due to the homogeneous heating of the substrate, is also homogeneous. The amount of deformation and the mask thickness are largely exaggerated in FIGS. 1 to 5 for the sake of visibility and better clarity.

Since the allowable target registration error for mask manufacturing in leading-edge production nodes is typically in the order of 1 nm $3\sigma$, the above distortion of up to about 35 nm results in a registration error which requires suitable correction.

Mechanical Deformation

Figure 3:
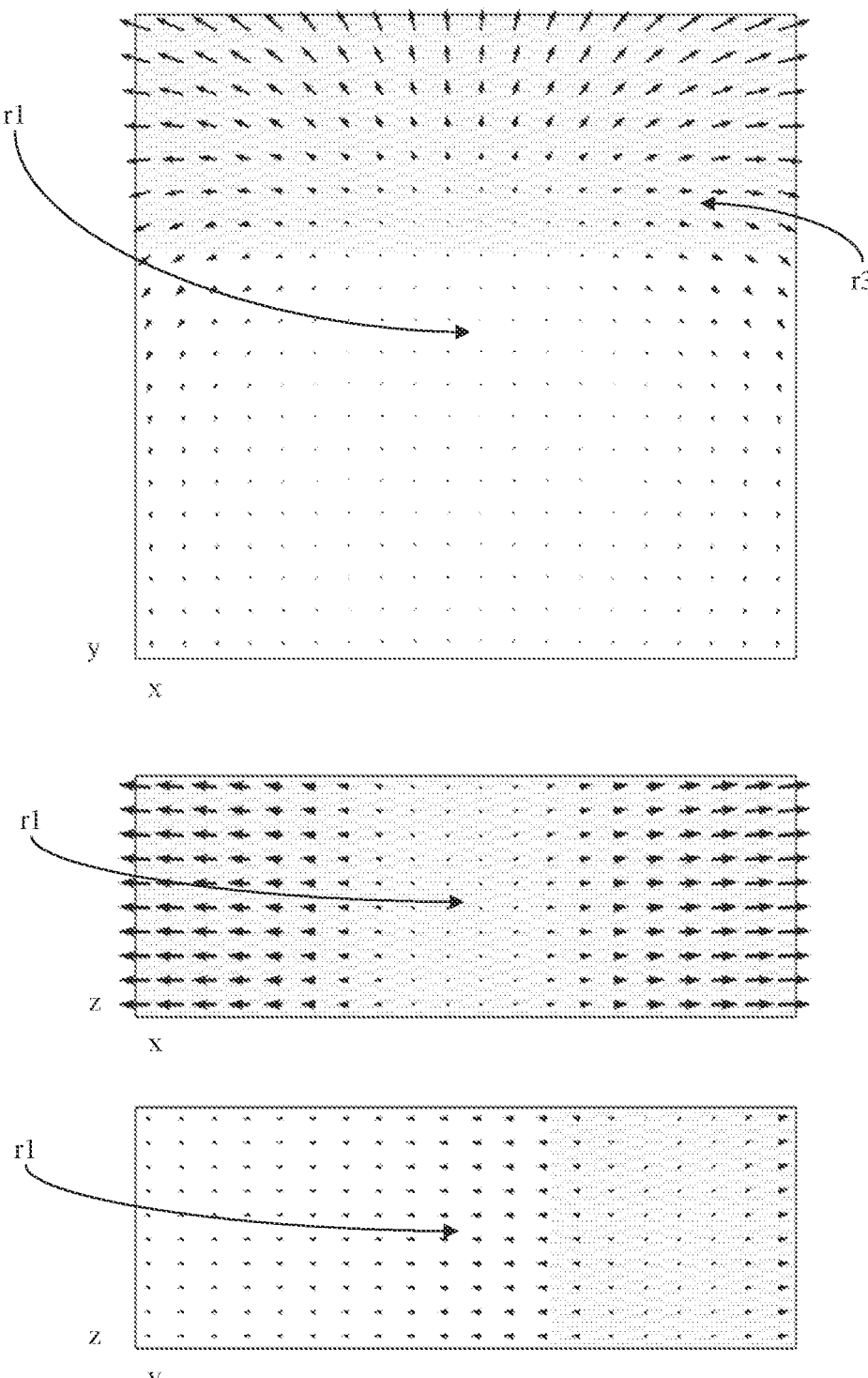
FIG. 3 depicts an example of a thermal expansion of a non-homogeneously heated substrate.
Figure 4:
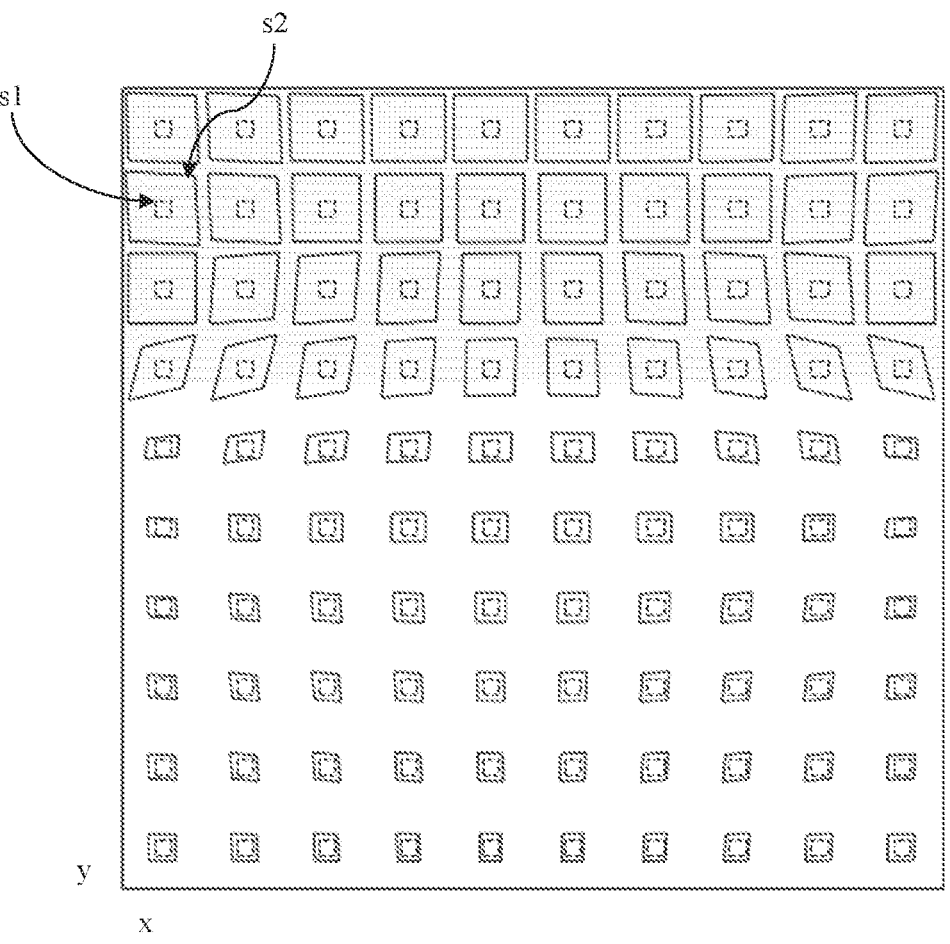
FIG. 4 illustrates the thermal strain in the substrate of FIG. 3.

In an actual photomask, the temperature distribution is typically not homogeneous, as the heat introduced at a writing position does not diffuse within the entire substrate sufficiently fast. For such a non-homogeneous temperature distribution, the precise deformation of the mask depends not only on the thermal characteristics of the substrate, but also on its mechanical properties. A typical example is shown in FIG. 3, in the same projection planes as FIG. 1, with the mask center r1 again used as a reference point. Here, the mask is only partially heated, namely in the area r3 depicted hatched. The resulting distortion is no longer homogenous as in the case of FIG. 1, but varies depending on the location. Furthermore, the corresponding thermomechanical strain, which is depicted in the xy-plane in FIG. 4, varies across the mask and shows a shearing effect (i.e. infinitesimal elements s1 are deformed to non-rectangular parallelepipeds s2), in particular in the thermal transition area.

Figure 5A:
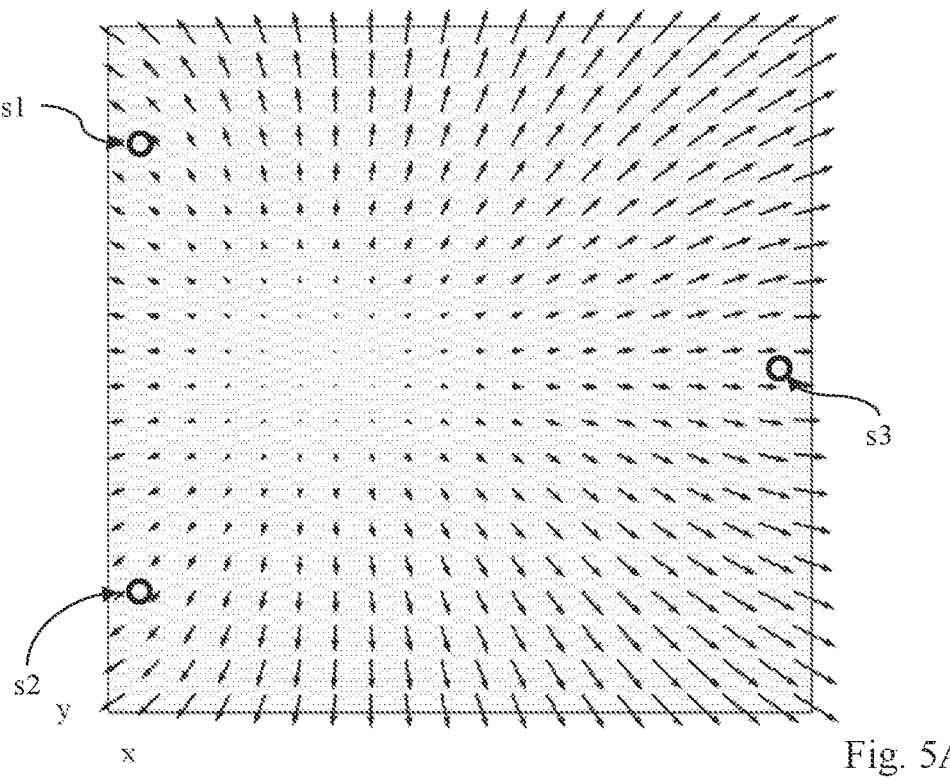
FIGS. 5A and 5B illustrate distortion of a substrate which is mounted at three positions, with FIG. 5A illustrating the case of three sliding mounts which allow a small amount of movement at the mounting positions, and FIG. 5B illustrating the case of clamping mounts which fix the substrate at the mounting points.
Figure 5B:
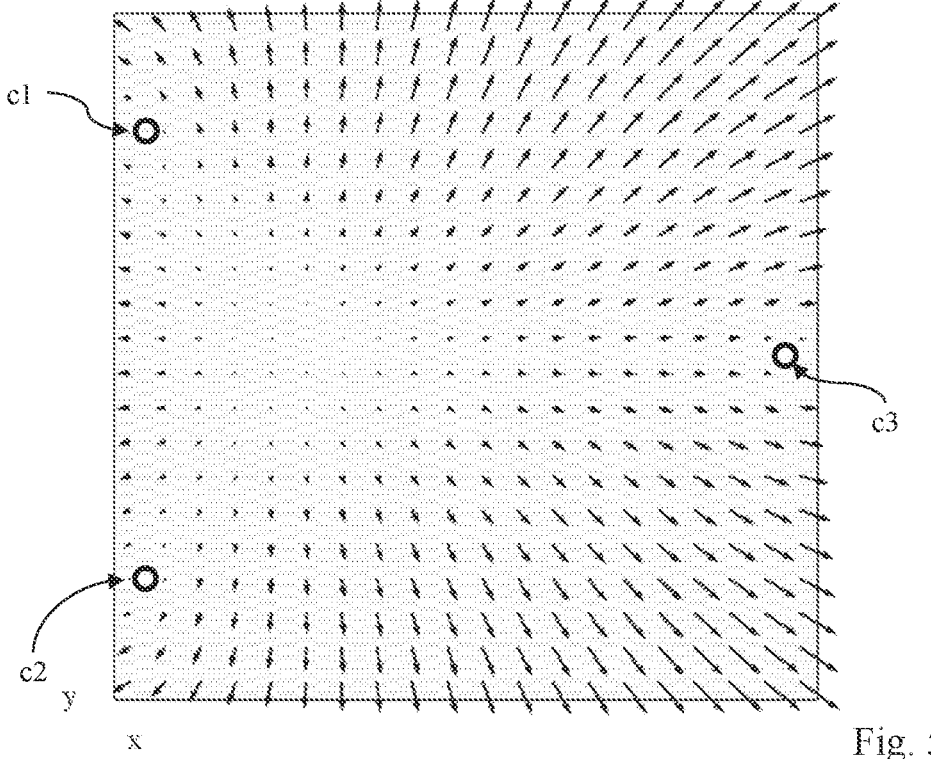

Furthermore, the reticle is usually mounted to the stage at certain mounting points, so it is not free to expand in all directions equally. The effect on the distortion is visualized in FIG. 5A and FIG. 5B with simulation data in the xy-plane. In FIG. 5B, the substrate is fixed at three positions c1, c2, c3 with clamping mounts which allow very little movement of the mask against the stage. In FIG. 5A, the mask is mounted at positions s1, s2, s3 with sliding mounts which fix the mask position by friction, allowing some movement. In both cases, the mask distortion is more pronounced towards the right side of the mask, in particular the upper and lower right corners and muted towards the left side.

Thermal Model

The invention proposes a model for describing both for the thermal and the mechanical behavior of the mask. In particular, diffusion of the temperature distribution T at a position r and time t is favorably described by the inhomogeneous heat equation $$\frac{\partial T(r, t)}{\partial t} = \nabla \cdot (\alpha(r) \nabla T(r, t)) + S(r, t) \qquad \text{(Heat equation)}$$

for an isotropic medium with thermal diffusivity $\alpha(r)$, which can usually be considered constant, and a source-sink function $S(r,t)$ which describes the thermal energy delivered to and dissipated by the mask. Since the mask is, in accordance with typical process implementations, placed in a vacuum with small contacts, the main mode of thermal dissipation is radiative. By Stefan-Boltzmann's law, for a given ambient temperature $T_0$ of the exposure apparatus (in a typical implementation, this will also be the so-called soaking temperature of the substrate) the radiative heat power density is $$R(r, t) = \overline{\in} \sigma \left( T(r, t)^4 - T_0^4 \right)$$

(Radiative emission), where $\overline{\in}$ is the emissivity of the substrate and a the Stefan-Boltzmann constant. Since typically the mask temperature is not too far away from the ambient temperature, $T(r,t) \approx T_0$, a good approximation amenable to computer-implementation is possible by linearization, i.e., $$R(r, t) = 4\overline{\in} \sigma T_0^3 (T(r, t) - T_0)$$

(Linearized radiative emission).

Additionally, the mask is heated by the incident charged particle beam. With its power density given by $B(r,t)$ and, introducing a coupling constant $\gamma$ that determines how much of the beam's energy is converted into heat, and disregarding conductive heat transfer over the substrate mounts, the source-sink function is $$S(r,t) = \gamma B(r,t) - R(r,t).$$

Thermal strain (i.e. the relative length expansion $$\frac{\Delta L}{L}$$

of an infinitesimal element) relative to the a reference temperature $T_1$ (which will usually equal the ambient temperature $T_0$) is proportional to the temperature change, that is, $$\tau(r,t) = \alpha_L (T(r,t) - T_1).$$

The constant of proportionality $\alpha_L$ is the thermal expansion coefficient, which can reasonably be assumed constant in the context of the invention.

Mechanical Model

To calculate the mechanical deformation following thermal expansion, the well-established theory of linear elasticity is a suitable model for the invention. It is governed by the equations $$\nabla \cdot \sigma(r, t) + F(r, t) = \rho \frac{\partial^2}{(\partial t)^2} u(r, t) \qquad \text{(Equation of motion)}$$

-continued $$\epsilon(r,\,t) = \frac{1}{2}\left(\nabla u(r,\,t) + (\nabla u(r,\,t))^T\right) \quad \text{(Strain–displacement relation)}$$

$$\sigma(r,\,t) = C{:}\epsilon(r,\,t) \quad \text{(Hooke's law)}$$

or, in index notation, for $i, j \in \{1,2,3\}$, $$\sum_k \frac{\partial \sigma_{ik}}{\partial k} + F_i = \rho \frac{\partial^2}{(\partial t)^2} u_i \quad \text{(Equation of motion)}$$

$$\epsilon_{ik} = \frac{1}{2}\left(\frac{\partial u_i}{\partial x_j} + \frac{\partial u_j}{\partial x_i}\right) \quad \text{(Strain–displacement relation)}$$

$$\sigma_{ij} = \sum_{kl} C_{ijkl} \epsilon_{kl} \quad \text{(Hooke's law)}$$

where $\sigma = \sigma_{ij}(r,t)$ and $\epsilon = \epsilon_{ij}(r,t)$ are the second-order mechanical stress and strain tensors, $u = u_i(r,t)$ the mechanical displacement vector and $C = C_{ijkl}$ the fourth-order stiffness tensor, $F = F_i(r,t)$ an external force vector and $\rho$ the material density (which we can assume constant for the sake of the invention).

In a favorable embodiment of the invention, the substrate is assumed to be mechanically isotropic, which implies that the stiffness tensor is determined by a set of two scalar material parameters, and Hooke's law can be simplified. In particular, $$\sigma_{ij} = 2\mu\epsilon_{ij} + \lambda\delta_{ij}\sum_k \epsilon_{\kappa\kappa} \quad \text{(Hooke's law for isotropic media)}$$

where the two scalars $\lambda$, $\mu$ are the Lamé parameters, which are readily expressed by other common material parameters, $$\text{e.g. } \lambda = \frac{Ev}{(1 + v)(1 - 2v)} \text{ and } \mu = \frac{E}{2(1 + v)}$$

for Young's modulus E and Poisson's ratio $v$. Typical values are $E = 17 \cdot 10^{10}$ Pa and $v = 0.17$ (for fused quartz).

In a suitable embodiment of the invention, since temperature changes only slowly on the mask scale, mechanical deformation is calculated statically for a given temperature distribution, i.e. taking $$\frac{\partial}{\partial t} u = 0.$$

The equations of isotropic linear elasticity can then be combined to form $$\text{(Navier–Cauchy–equations)}$$

$$(\lambda + \mu)\sum_k \frac{\partial^2 u_k}{\partial x_i \partial x_k} + \mu\sum_k \frac{\partial^2 u_i}{(\partial x_k)^2} = -F_i.$$

Full Model

Combing the thermal strain $\tau = \tau_{ij} = \delta_{ij}\alpha_L(T - T_1)$ (which is isotropic) with mechanical strain $\epsilon = \epsilon_{ij}$ in the strain-displacement relation leads to $$\text{(Strain–displacement relation with thermal expansion)}$$

$$\epsilon_{ij} = \frac{1}{2}\left(\frac{\partial u_i}{\partial x_j} + \frac{\partial u_j}{\partial x_i}\right) - \delta_{ij}\alpha_L(T - T_1)$$

where u is the total (mechanical plus thermal) displacement, and, combined the with the other equations of linear elasticity (again assuming static deformation and isotropic material), $$\text{(Thermomechanical Navier – Cauchy)}$$

$$(\lambda + \mu)\sum_k \frac{\partial^2 u_k}{\partial x_i \partial x_k} + \mu\sum_k \frac{\partial^2 u_i}{(\partial x_k)^2} = -F_i - \alpha_L(2\mu + 3\lambda)\frac{\partial(T - T_1)}{\partial x_i}.$$

External Forces

The force density vector F contains all external forces acting on the substrate. Of particular importance is the gravitational force $$F(r,t) = -g\rho(r,t)\hat{e}_z,$$

which leads to a sagging mask and a slightly different distortion signature under thermal fluctuations.

Boundary Conditions and Mounts

To solve the above equations, boundary conditions for stress, strain or distortion have to be supplied as well. On free points $z_f$ of the mask surface, the mask experiences no normal stress (since it can move inwards and outwards freely), so using a surface normal vector n we have $$\sigma(z_f,t) \cdot n(z_f) = 0.$$

Figure 6A:
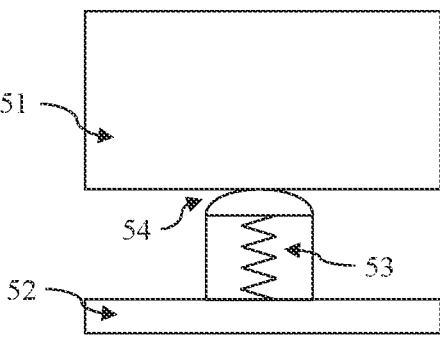
FIGS. 6A and 6B illustrate examples of mounting, namely.

On the rest of the mask surface, details of the mount used to fix the substrate to stage (e.g. the force it generates against the surface) have to considered to accurately determine the mechanical deformation. A spring or frictional mount 54 (illustrated in FIG. 6A, with an exemplary distortion in FIG. 5A), for instance, allows the substrate 51 to slightly move against the stage 52. The spring 53 generates a defined traction $T = T_0 + Ku$ proportional to the displacement with the spring tensor K, plus an applied traction $T_0$, at points $z_s$ on the contact surface. We thus have $$\sigma(z_s,t) \cdot n(z_s) = T(z_s) = T_0(z_s) + Ku(z_s)$$

Figure 6B:
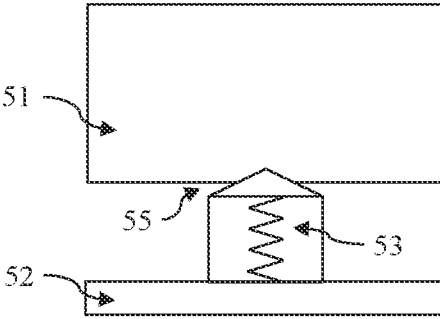

A clamping mount 55, as illustrated in FIG. 6B with an exemplary distortion in FIG. 5B, on the other hand, locks the movement of the substrate 51 against the stage 52 almost entirely by locally generating a (small) dent in the substrate. This corresponds to the special case $K \rightarrow \infty$ of the spring mount above. Points $z_c$ on the mask surface which are fixed by clamping mounts are not thermally distorted, that is, $$u_1(z_c) = u_2(z_c) = u_3(z_c) = 0.$$

Determination of Parameters

Most material parameters appearing in the above equations are well-known and easily obtainable, with the exception of only a small number of unknown parameters of the system, such as the beam's power-to-heat-ratio $\gamma$ (which depends on the way the electrons interact with the substrate) and the substrate emissivity $\overline{\in}$ (which depends on the geometry of the exposure chamber 90 and thermal properties of the exposure apparatus in the vicinity of the substrate). For the purpose of the invention, the beam power density B(r,t) associated with each exposure position can be determined (i.e., identified by suitable measurement and/or calculation) with sufficient precision relative to the thermome-chanical simulation grid from quantities that are typically monitored during a writing process in a charged particle lithographic apparatus, such as the beam position, pattern density and beam current. Determining the actual beam current (of the entire beam), in particular, can be suitably achieved, based on reference measurements, by monitoring the actual feeding current of the particle source and its variation over time. Any further input data of possible interest are easily derived from quantities that are monitored in the charged particle lithographic apparatus.

In an embodiment of the invention, the power-to-heat-ratio $\gamma$ and substrate emissivity $\in$ are determined by heating the substrate using the charged particle beam with a defined power and performing in-situ measurements of the resulting temperature change of the substrate in time. These measurements can then be used to obtain the desired parameters, e.g. by least-squares fitting of the expected to the measured temporal behavior.

Figure 9:
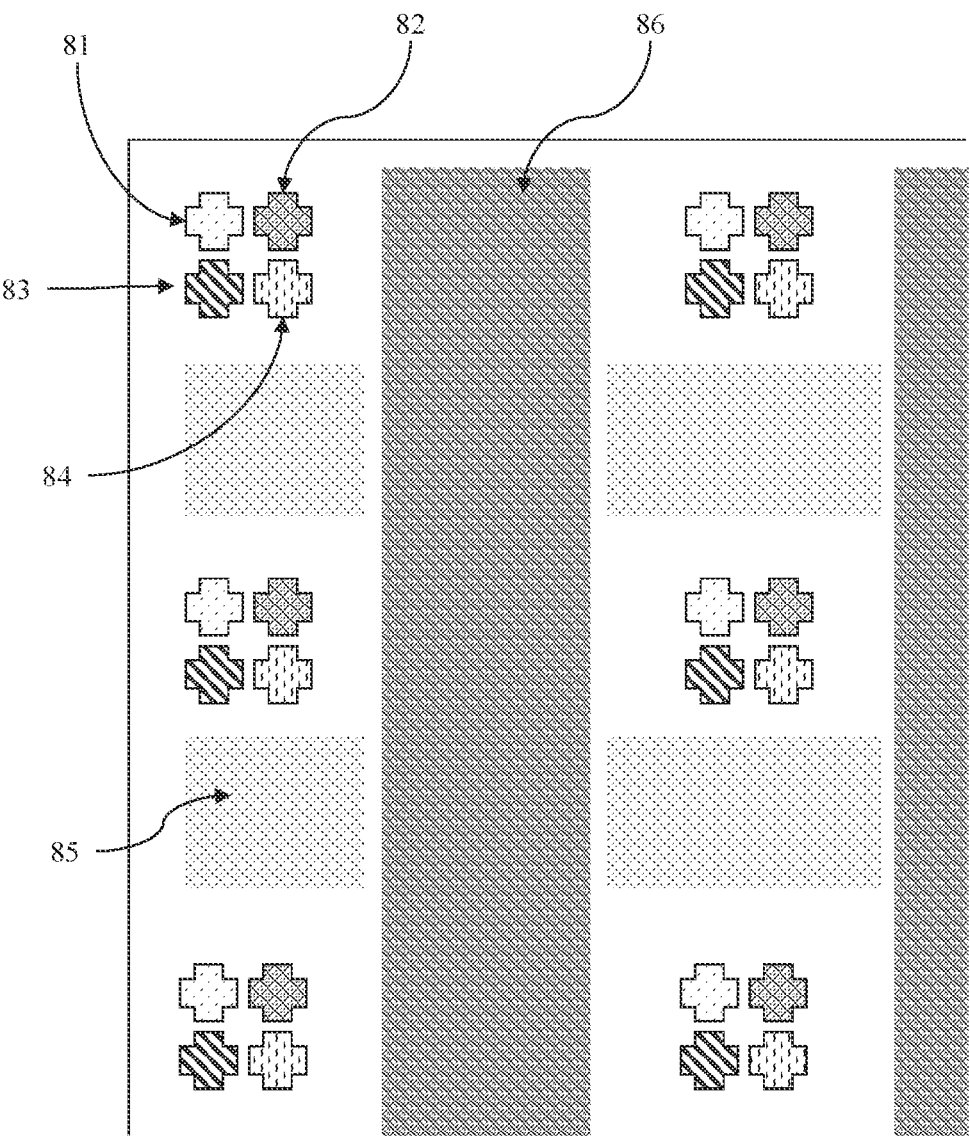
FIG. 9 depicts a test substrate as produced for performing an in-situ measurement of model parameters such as the power-to-heat-ratio and substrate emissivity.

In another embodiment of the invention, the power-to-heat-ratio $\gamma$ and substrate emissivity $\in$ are determined by heating the substrate using the charged particle beam with a defined power and performing in-situ measurements of the resulting substrate deformation. An example procedure is described below for a test substrate as illustrated, not to scale, in FIG. 9. In a first step, a set of first reference markers 81 is written on a substrate at reference temperature $T_1$. Then, after writing a low-density dummy pattern 85, a set of first distortion markers 82 with a given nominal offset to the first reference markers 81 are exposed. Next, a high-density dummy pattern 86 and another set of second distortion markers 83 are exposed. The dummy patterns 85, 86 are areas, for instance stripes extending across the width or length of the substrate, and may have any suitable shape, such as linear stripes, a chain of individual areas (of e.g. rectangular or circular shape) or areas in a zig-zag arrangement. Finally, after a defined cool-down period, a set of second distortion markers 84 is written. By comparing the measured offset of the reference markers 81, 84 and the distortion markers 82, 83 to the nominal offset after the exposure process, an experimental distortion is determined (note that in a real experiment, more sets of markers and stages of heating/cooling will be used). Then, the thermo-mechanical model introduced above can be used to determine unknown parameters of the system, including the power-to-heat-ratio $\gamma$ and substrate emissivity $\in$ (which are directly related to the heating and cooling rate) from the distortion as determined by the above experimental procedure and the defined exposure parameters, e.g. by non-linear least-squares fitting. The same approach may be used for determining further mechanical or thermo-mechanical parameters such as elastic moduli or thermal expansion or diffusion coefficients, e.g. when using composite substrates for which these parameters are not readily available; determination of one or more of such further parameters may then be achieved in a likewise fashion by an experimental procedure and/or fitting of the parameter(s) in question to data of previous corrections.

Computation Process

The equations above form a system of coupled partial differential equations, which can be solved using suitable state-of-the-art finite element method (FEM) software.

In a favorable embodiment of the invention, thermal distortion is calculated in real-time during exposure of the mask. This approach has the advantage that information only available at runtime, such as fluctuations of the current in the particle source ("gun") or delay or interruption occurring during exposure, can be incorporated into the simulation. This can be achieved, for instance, by iterating the steps shown in FIG. 7 within a time interval of duration $\Delta t$, where the steps represent one complete iteration repeat. In the first step 61 denoted "ES_SOURCE", the beam position and power for the current time interval [t, t+$\Delta t$] is determined or estimated (e.g. from exposure data). Then, in step 62 denoted "UD_THERMD", the temperature distribution T is updated, preferably taking into account both added heat and emissions, for instance by solving the heat equation and emission equation according to the above explanations. In step 63 denoted "UD_DISTOR", a mechanical mask model is used to calculate the thermal deformation relative to the undistorted state at the reference temperature $T_1$ or to a calculated deformation state obtained during a previous iteration step, for example by using the thermomechanical equations including the Navier-Cauchy equations as stated above. In the next step 64 denoted "UD_CRRMAP", a correction map is generated from the estimated thermome-chanical distortion. Then, in a final step 65 denoted "APCRR_WR", the correction as specified by the correction map is applied to the writing process as described in more detail below. Advantageously, the correction map is calculated at the same time or shortly before (e.g. 100 ms) the actual exposure of exposure positions considered in step 65. In the context of multi-beam mask writers, mostly diffuse mask-scale thermal deformation (and not local deformation next to the beam) is of interest. In this case, the added thermal deformation generated by an exposure position may also be calculated after its exposure and update intervals can be longer with loose synchronization.

Figure 7:
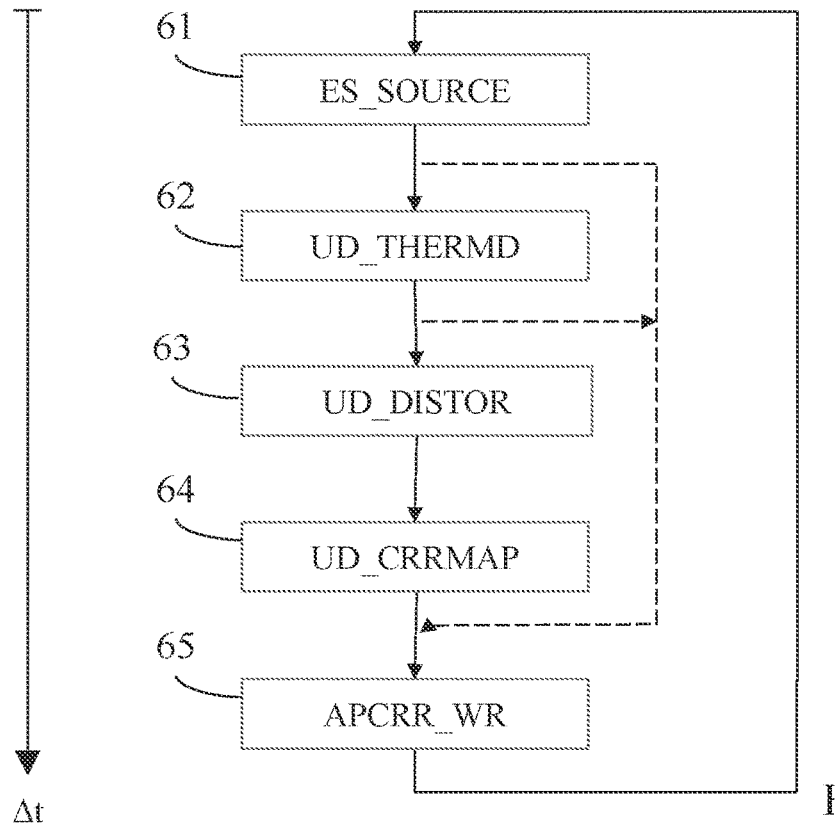
FIG. 7 illustrates a process of calculating a correction map for a thermomechanical distortion.

Preferably, the process of steps 61 □ 64 is repeated at predetermined intervals of time or for specific positions of the beam frame, for instance after each duration of time when the beam frame has travelled a predefined distance, such as a specific fraction of the length of the substrate (as measured in the longitudinal direction of a stripe), for instance every 1%, 2%, 5%, 10%, 20%, 25%, or 50% of the substrate length. It should be noted that such a choice of duration of time intervals will correspond to a travelling distance of the beam which is larger, often considerably larger, than the size of the total beam range on the target (since the beam has a defined finite size on the target surface). In some embodiments of the invention, the steps 63 and 64 are skipped in a large part of the repeats (e.g. more than 50%, 80%, or 90%), so that the temperature distribution is updated more often than the distortion and correction maps (which is indicated in FIG. 7 by dashed arrows that skip some of the steps); thus only a small fraction of the repeats are complete, i.e. contain an entire set of steps 61 □ 65. This reduces the computing time, since calculation of the distortion maps is computationally particularly expensive; furthermore, distortion maps typically change only slowly over time, which is why a less frequent update is sufficient, whereas rapidly updating the temperature distribution (e.g. using a finer time-discretization of the heat equation) was found to be helpful to properly capture heat diffusion and radiation.

In another embodiment of the invention, the underlying writing procedure includes a stripe scanning strategy, for instance as described in U.S. Pat. No. 9,053,906 by the applicant. Here, it is natural to use the stripe exposure duration or defined fractions thereof as a correction map update interval [t, t+$\Delta t$]. That is, before writing each stripe, the correction map is updated (using either past or predicted exposure positions and beam power).

Figure 8:
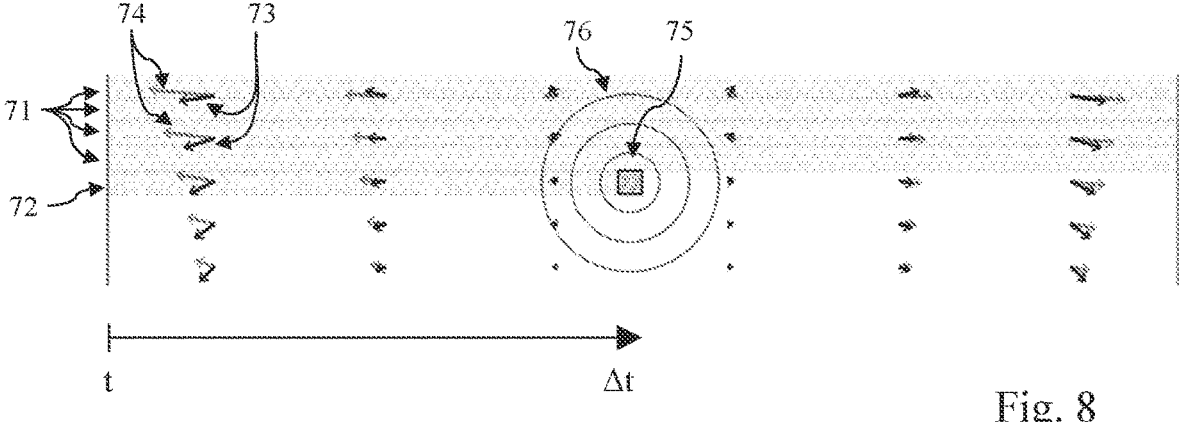
FIG. 8 illustrates an example of a correction map obtained during a writing process according to a stripe exposure approach.

FIG. 8 illustrates an example for a correction map as obtained for an update interval of half the exposure time of a stripe 72 being exposed. (FIG. 8 shows only a portion of the target, namely, only the portion corresponding to a few stripes 71, 72 which are exposed during a writing process.) The calculation of the correction map 74 for the stripe 72 is based on a previous correction map 73 that has been calculated for the preceding stripes, prior to exposure of the stripe 72, which correction map 73 (shown as black arrows in FIG. 8) was generated based on the thermomechanical deformation of the substrate, at time $t_k$, due to the heat applied during writing of the prior stripes 71, and this correction map is updated at specified points in time within the duration of the exposure of the stripe 72; for instance at half of the exposure time as shown in FIG. 8. The correction map contains the shift $u(r, t_k)$ that a position r in a grid of reference positions at reference temperature $T_1$ experiences at time $t_k$. At time $t_{k+1}=t_k+\Delta t$ (that is, in the illustrated case, half a stripe exposure time later) the correction map is updated to a new map 74 (shown as grey arrows in FIG. 8), taking into account the energy deposited during writing of the first portion of the stripe 72. It is to be noted that the scales of beam and mask distortion are highly exaggerated for visibility.

In a variant of the invention, the added heat determined in step 62 UD_THERMD is calculated with reduced accuracy, that is, with a lower resolution as compared to the simulation grid (e.g. triangular surface elements in a FEM implementation). Instead, the collected energy deposited in a subinterval $[\hat{t}, \hat{t}+\Delta\hat{t}]$ of the update interval $[t, t+\Delta t]$ (with $\hat{t}$ being a relevant point in time within the update interval, and $\Delta\hat{t}<\Delta t$ a subinterval length which, in typical embodiments of the invention, can be significantly smaller than $\Delta t$, for example, 10% thereof) is modeled as being deposited at the average beam position in the subinterval using a Gaussian heat distribution with a distribution significantly wider than the actual beam range 75 at the target. In FIG. 7B, the 1-, 2-, and 3-sigma level ranges of an exemplary distribution are depicted as concentric circles 76. The inventors found that this approach is simpler while being sufficiently accurate, and also offers more consistent thermomechanical distortion results when the grid resolution is changed (increased stability of simulations).

Applying the Correction

Once the distortion has been determined on the mask-scale, the distortion is compensated by modifying the beam position and/or pattern of the writing process in a suitable way (step 65 of FIG. 7). In a straightforward and simple approach, the exposure position of the beam is updated by shifting it to the distorted position, i.e. by a displacement distance according to in the local displacement u(r,t) (black arrows 73 in FIG. 8). This beam shift may be achieved by any suitable means for modifying the writing position of the beam at the location of the mask, for instance using a writing multipole in the projection optics system 93. For some implementations, however, such as in the context of a multi-beam charged particle exposure apparatus, it is expected that a correction of local distortions by other modification of the writing process may be more efficient. In particular, a pixel-based approach, as described by the applicant in U.S. Pat. No. 9,568,907, is proposed for an advantageous procedure to correct distortions with significant variation over a single beam-field. In particular, the pattern within the beam range at the beam position is re-calculated, for instance by dividing it into a number of portions, and each portion is shifted according to the local displacement u(r,t) at the location of a representative point of the respective portion. It is to be noted that the two mentioned approaches may be combined, i.e., one part of the correction for the local displacement may be done by a beam shift to an updated beam position, and the other part by re-calculating the pattern portion at the updated beam position.

What is claimed is:

1. A method for writing a pattern on a substrate in a charged particle lithographic apparatus using a scanning exposure by means of a charged particle beam, wherein the beam is directed to a sequence of exposure positions on a surface of the substrate, and at each exposure position the beam is used to write structures on the substrate within a beam range around the respective exposure position according to a respective pattern portion which represents a corresponding sub-region of the pattern to be written, the method comprising the following steps performed with regard to a respective exposure position:

determining, based on the exposure position, the power of the beam imparted to the substrate at the exposure position;

calculating heating of the substrate generated by the beam during an exposure duration associated with the exposure position, and calculating, for a plurality of locations defined in a predetermined array over the surface of the substrate, the amount of thermal diffusion and radiative cooling due to thermal emission of the substrate;

calculating, for a plurality of locations defined in a predetermined array over the surface of the substrate, the positional change of the substrate and mechanical strain in the substrate resulting from thermal expansion based on the results of the previous step;

calculating a displacement distance, said displacement distance describing said positional change at the exposure position, and applying a correction with respect to the exposure position and/or the pattern portion associated with the exposure position using the displacement distance, continuing writing structures on the substrate by means of the beam according to the exposure position and pattern portion thus corrected, wherein the above steps are carried out for each of a sequence of exposure durations, each of said exposure durations covering a time interval associated with one or more subsequent exposure positions, wherein the calculations for a respective time interval are done with respect to the results of the calculations obtained for the time interval respectively preceding the respective time interval; and wherein calculating mechanical strain in the substrate includes effects of mechanical stress introduced by external forces including holding forces applied to the substrate at two or more fixed mounting positions.

2. The method of claim 1, wherein the step of applying a correction to the pattern portion associated with the exposure position using the displacement distance comprises at least one of (i) shifting the exposure position of the beam by a first displacement to obtain an updated exposure position, and (ii) recalculating the pattern portion by shifting structures contained in the pattern portion by a second displacement to obtain an updated pattern portion, where the displacement distance results from said at least one of the first and second displacements, followed by writing structures on the substrate by means of the beam according to the exposure position and pattern portion thus updated.

3. The method of claim 1, wherein in the step of calculating heating of the substrate generated by the beam on the substrate, the energy deposited by the beam during a time interval associated with one or more subsequent exposure positions is modeled as being deposited by a sequence of heating spots, each heating spot having a heat insertion distribution according to a predetermined spatial distribution and being centered at one of a sequence of deposition positions representing the average of the beam position over a respective subinterval of the time interval, said predetermined spatial distribution having a width which is wider than the actual beam range at the substrate.

4. The method of claim 1, wherein in the step of calculating the heating of the substrate by the beam, the rate of heating is calculated as being proportional to a predetermined beam power, by a constant of proportionality.

5. The method of claim 4, wherein said constant of proportionality is determined beforehand by writing markers on a test substrate at several different stages of a writing process, measuring deformation positions of said writing markers, and performing a best-fit calculation of the constant of proportionality to the deformation positions thus measured.

6. The method of claim 4, wherein said constant of proportionality is determined by fitting to substrate temperature measurements performed beforehand on a test substrate undergoing a test writing process in the same charged particle lithographic apparatus where thereafter the pattern is written on the substrate, the test substrate and the test writing process being representative for the substrate and the pattern written on the substrate.

7. The method of claim 1, wherein at least one parameter which relates to a mechanical or thermomechanical property of the substrate is determined using a test substrate by performing a test writing process in the same charged particle lithographic apparatus where thereafter the pattern is written on the substrate, the test substrate and the test writing process being representative for the substrate and the pattern written on the substrate, measuring quantities enabling to determine said at least one parameters, and calculating said at least one parameter from the quantities thus measured.

8. The method of claim 1, wherein the steps of claim 1 are performed in real-time during a process for writing the pattern on the substrate using actual exposure positions, pattern and current density values registered by the exposure control system.

9. The method of claim 1, wherein the substrate is exposed using a stripe-scanning writing method, writing structures on the substrate stripe by stripe, and the calculating steps of claim 1 are performed for a number of consecutive durations which each correspond to a respective portion of each stripe before writing the structures of the pattern portions that belong to the respective stripe or portion of the stripe.

10. The method of claim 1, wherein the step of calculating heating of the substrate generated by the beam on the substrate at the exposure position also includes prior heating of the substrate generated by the beam during its path on the substrate prior to said exposure position.

11. The method of claim 1, wherein the step of calculating the amount of thermal diffusion and radiative cooling is repeated for a sequence of exposure durations, which respectively comprise a number of subsequent exposure positions extending over at least a first distance which is larger than the width of a beam range on the substrate surface.

12. The method of claim 11, wherein the step of calculating the positional change of the substrate is repeated for a sequence of secondary durations which has a lower update ratio than the sequence of exposure durations, wherein said secondary durations respectively comprise a number of subsequent exposure positions extending over at least a second distance which is larger than said first distance.

13. The method of claim 1, wherein the amount of positional change at each of the two or more fixed mounting positions is a predetermined value.

14. The method of claim 13, wherein the predetermined value of said amount of positional change is zero positional change.

15. A method for writing a pattern on a substrate in a charged particle lithographic apparatus using a scanning exposure by means of a charged particle beam, wherein the beam is directed to a sequence of exposure positions on a surface of the substrate, and at each exposure position the beam is used to write structures on the substrate within a beam range around the respective exposure position according to a respective pattern portion which represents a corresponding sub-region of the pattern to be written, the method comprising the following steps performed with regard to a respective exposure position:

determining, based on the exposure position, the power of the beam imparted to the substrate at the exposure position;

calculating heating of the substrate generated by the beam during an exposure duration associated with the exposure position, and calculating, for a plurality of locations defined in a predetermined array over the surface of the substrate, the amount of thermal diffusion and radiative cooling due to thermal emission of the substrate, wherein thermal diffusion is calculated using the inhomogeneous heat equation including a source-sink function which includes thermal emissivity calculated as proportional, by a common constant of proportionality, to one of: the difference of fourth powers of the substrate temperature and ambient temperature; and the difference of the substrate temperature to an ambient temperature;

calculating, for a plurality of locations defined in a predetermined array over the surface of the substrate, the positional change of the substrate resulting from thermal expansion based on the results of the previous step;

calculating a displacement distance, said displacement distance describing said positional change at the exposure position, and applying a correction with respect to the exposure position and/or the pattern portion associated with the exposure position using the displacement distance, continuing writing structures on the substrate by means of the beam according to the exposure position and pattern portion thus corrected, wherein the above steps are carried out for each of a sequence of exposure durations, each of said exposure durations covering a time interval associated with one or more subsequent exposure positions, wherein the calculations for a respective time interval are done with respect to the results of the calculations obtained for the time interval respectively preceding the respective time interval, wherein said common constant of proportionality of thermal emissivity is determined beforehand by writing markers on a test substrate at several different stages of a writing process, measuring deformation positions of said writing markers, and performing a best-fit calculation of the constant of proportionality to the deformation positions thus measured; and wherein the substrate is held at two or more fixed mounting positions.

16. A method for writing a pattern on a substrate in a charged particle lithographic apparatus using a scanning exposure by means of a charged particle beam, wherein the beam is directed to a sequence of exposure positions on a surface of the substrate, and at each exposure position the beam is used to write structures on the substrate within a beam range around the respective exposure position according to a respective pattern portion which represents a corresponding sub-region of the pattern to be written, the method comprising the following steps performed with regard to a respective exposure position:

determining, based on the exposure position, the power of the beam imparted to the substrate at the exposure position;

calculating heating of the substrate generated by the beam during an exposure duration associated with the exposure position, and calculating, for a plurality of locations defined in a predetermined array over the surface of the substrate, the amount of thermal diffusion and radiative cooling due to thermal emission of the substrate, wherein thermal diffusion is calculated using the inhomogeneous heat equation including a source-sink function which includes thermal emissivity calculated as proportional, by a common constant of proportionality, to one of: the difference of fourth powers of the substrate temperature and ambient temperature; and the difference of the substrate temperature to an ambient temperature;

calculating, for a plurality of locations defined in a predetermined array over the surface of the substrate, the positional change of the substrate resulting from thermal expansion based on the results of the previous step;

calculating a displacement distance, said displacement distance describing said positional change at the exposure position, and applying a correction with respect to the exposure position and/or the pattern portion associated with the exposure position using the displacement distance, continuing writing structures on the substrate by means of the beam according to the exposure position and pattern portion thus corrected, wherein the above steps are carried out for each of a sequence of exposure durations, each of said exposure durations covering a time interval associated with one or more subsequent exposure positions, wherein the calculations for a respective time interval are done with respect to the results of the calculations obtained for the time interval respectively preceding the respective time interval, wherein said common constant of proportionality is determined by fitting to substrate temperature measurements performed beforehand on a test substrate undergoing a test writing process in the same charged particle lithographic apparatus where thereafter the pattern is written on the substrate, the test substrate and the test writing process being representative for the substrate and the pattern written on the substrate; and wherein the substrate is held at two or more fixed mounting positions.

\* \* \* \* \*